(12) United States Patent
Liu (10) Patent No.: US 11,252,822 B1
(45) Date of Patent: Feb. 15, 2022

(54) FLEXIBLE PRINTED CIRCUIT BOARD AND DISPLAY APPARATUS HAVING THE SAME

(71) Applicant: HIMAX TECHNOLOGIES LIMITED, Tainan (TW)

(72) Inventor: Hsuan-Ching Liu, Tainan (TW)

(73) Assignee: Himax Technologies Limited, Tainan (TW)

(*) Notice: Subject to any disclaimer, the term of this patent is extended or adjusted under 35 U.S.C. 154(b) by 0 days.

(21) Appl. No.: 17/098,473

(22) Filed: Nov. 16, 2020

(51) Int. Cl.
*H05K 1/00* (2006.01)
*H05K 1/18* (2006.01)
*G02F 1/1345* (2006.01)

(52) U.S. Cl.
CPC .......... *H05K 1/189* (2013.01); *G02F 1/13452* (2013.01); *H05K 2201/10136* (2013.01)

(58) Field of Classification Search
CPC .......... H05K 1/189; H05K 2201/10136; G02F 1/13452
See application file for complete search history.

(56) References Cited

U.S. PATENT DOCUMENTS

| | | | | |
|---|---|---|---|---|
| 5,986,739 | A * | 11/1999 | Kobayashi | G02F 1/1309 349/143 |
| 9,414,533 | B2 * | 8/2016 | Yanagihara | H01R 9/032 |
| 10,709,010 | B1 * | 7/2020 | Chen | H05K 1/118 |
| 2006/0244741 | A1 * | 11/2006 | Kimura | G02F 1/1368 345/204 |
| 2007/0109759 | A1 * | 5/2007 | Torii | H05K 1/0271 361/777 |
| 2013/0258911 | A1 * | 10/2013 | Choksi | H03H 7/463 370/277 |
| 2016/0071798 | A1 * | 3/2016 | Komiya | H01L 24/06 257/499 |
| 2016/0357378 | A1 * | 12/2016 | Kang | G06F 1/1601 |
| 2017/0245379 | A1 * | 8/2017 | Kang | G01R 31/52 |
| 2018/0314099 | A1 * | 11/2018 | Saitoh | G02F 1/1345 |
| 2018/0315776 | A1 * | 11/2018 | Chuang | G02F 1/1303 |
| 2020/0037434 | A1 * | 1/2020 | Ueda | H05K 1/028 |

* cited by examiner

*Primary Examiner* — Yuriy Semenenko
(74) *Attorney, Agent, or Firm* — CKC & Partners Co., LLC (57) ABSTRACT

A flexible printed circuit (FPC) board includes a base film, a pair of traces and a chip. The pair of traces are disposed on the base film, and each trace has opposite first and second terminals. The chip is disposed on the base film and has pins that are respectively coupled to the first terminals of the traces. When the FPC board is bonded to a panel through the second terminals of the traces that are shorted to each other, the chip is configured to transmit a detection signal through one of the pins and receive a reception signal through the other of the pins, and to determine whether the FPC board works normally with the panel depending on the reception signal.

20 Claims, 9 Drawing Sheets

FLEXIBLE PRINTED CIRCUIT BOARD AND DISPLAY APPARATUS HAVING THE SAME

BACKGROUND

Field of the Invention

The invention relates to a flexible printed circuit board, and more particularly to a flexible printed circuit board with an auto defect detection function and a display apparatus having the same.

Description of Related Art

Recently, displays are widely used for in-vehicle applications, such as video display, vehicle-related information display, traffic conditions notification and/or the like. Moreover, chip-on-film (COF) technologies may be applied to an in-vehicle display to further reduce its occupied space. However, a COF package used in such in-vehicle display would crack and/or have bonding defects due to over-bending.

SUMMARY

One aspect of the invention directs to a flexible printed circuit (FPC) board that includes a base film, a pair of first traces and a chip. The pair of first traces are disposed on the base film, and each first trace has opposite first and second terminals. The chip is disposed on the base film and has first pins that are respectively coupled to the first terminals of the first traces. When the FPC board is bonded to a display panel through the second terminals of the first traces that are shorted to each other, the chip is configured to transmit a first detection signal through one of the first pins and receive a first reception signal through the other of the first pins, and to determine whether the FPC board works normally with the display panel depending on the first reception signal.

In accordance with one or more embodiments of the invention, the first traces are located at one longitudinal side edge of the base film.

In accordance with one or more embodiments of the invention, the first traces are respectively located at two opposite longitudinal side edges of the base film.

In accordance with one or more embodiments of the invention, the FPC board further includes a pair of second traces that are disposed on the base film, each second trace has opposite first and second terminals. The chip further has second pins that are respectively coupled to the first terminals of the second traces, and when the FPC board is also bonded to a control board through the second terminals of the second traces that are shorted to each other, the chip is also configured to transmit a second detection signal through one of the second pins and receive a second reception signal through the other of the second pins, and to determine whether the FPC board works normally with the display panel and the control board depending on the first and second reception signals.

In accordance with one or more embodiments of the invention, the first traces and the second traces are located at one longitudinal side edge of the base film.

In accordance with one or more embodiments of the invention, one of the first traces and one of the second traces are located at one longitudinal side edge of the base film, and the other of the first traces and the other of the second traces are located at the other longitudinal side edge of the base film.

In accordance with one or more embodiments of the invention, the second detection signal is an invented signal of the first detection signal.

In accordance with one or more embodiments of the invention, the chip includes a detection signal generator, an inverter and a test signal detector. The detection signal generator is configured to generate the first detection signal according to a synchronization signal. The inverter is configured to invert the first detection signal to obtain the second detection signal. The test signal detector is configured to receive and process the first and second reception signals to determine whether the FPC board works normally with the display panel and the control board.

In accordance with one or more embodiments of the invention, the chip further includes an equalizer that is configured to equalize the first detection signal and the second detection signal.

In accordance with one or more embodiments of the invention, the test signal detector includes a logic operator, a sampler and a determinator. The logic operator is configured to perform an exclusive-OR logic operation on the first and second reception signals to obtain an identification signal. The sampler is configured to perform sampling on the identification signal. The determinator is configured to determine whether the FPC board works normally with the display panel and the control board based on the sampling result of the sampler on the identification signal.

Another aspect of the invention is directed to a display apparatus that includes a display panel, a control board and a flexible printed circuit (FPC) board. The control board is for controlling display of the display panel. The FPC board is bonded to the display panel and the control board. The FPC board includes a base film, a chip, a pair of first traces and a pair of second traces. The chip is disposed on the base film and has first pins and second pins. The pair of first traces are disposed on the base film, and each first trace has opposite first and second terminals. The first terminals of the first traces are coupled to the first pins of the chip, and the FPC board is bonded to the display panel through the second terminals of the first traces. The pair of second traces are disposed on the base film, and each second trace has opposite first and second terminals. The first terminals of the second traces are coupled to the second pins of the chip, and the FPC board is bonded to the display panel through the second terminals of the second traces. The chip is configured to transmit a first detection signal and a second detection signal respectively through one of the first pins and one of the second pins and receive a first reception signal and a second reception signal respectively through the other of the first pins and the other of the second pins, and to determine whether the FPC board works normally with the display panel and the control board depending on the first reception signal and the second reception signal.

In accordance with one or more embodiments of the invention, the chip is a display driver IC (DDI) or a touch and display driver integration (TDDI) chip.

In accordance with one or more embodiments of the invention, the display panel is a liquid crystal display panel.

In accordance with one or more embodiments of the invention, the control board comprises a front-end video processor and a microcontroller unit (MCU).

BRIEF DESCRIPTION OF THE DRAWINGS

The foregoing aspects and many of the accompanying advantages of this invention will become more readily appreciated as the same becomes better understood by reference to the following detailed description, when taken in conjunction with the accompanying drawings.

DETAILED DESCRIPTION

The detailed explanation of the invention is described as following. The described preferred embodiments are presented for purposes of illustrations and description, and they are not intended to limit the scope of the invention.

Terms used herein are only used to describe the specific embodiments, which are not used to limit the claims appended herewith. Unless limited otherwise, the term "a," "an," "one" or "the" of the single form may also represent the plural form. Further, the spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In the following description and claims, the term "coupled" along with their derivatives, may be used. In particular embodiments, "coupled" may be used to indicate that two or more elements are in direct physical or electrical contact with each other, or may also mean that two or more elements may not be in direct contact with each other. "Coupled" may still be used to indicate that two or more elements cooperate or interact with each other.

The document may repeat reference numerals and/or letters in the various examples. This repetition is for the purpose of simplicity and clarity and does not in itself dictate a relationship between the various embodiments and/or configurations discussed.

Figure 1:
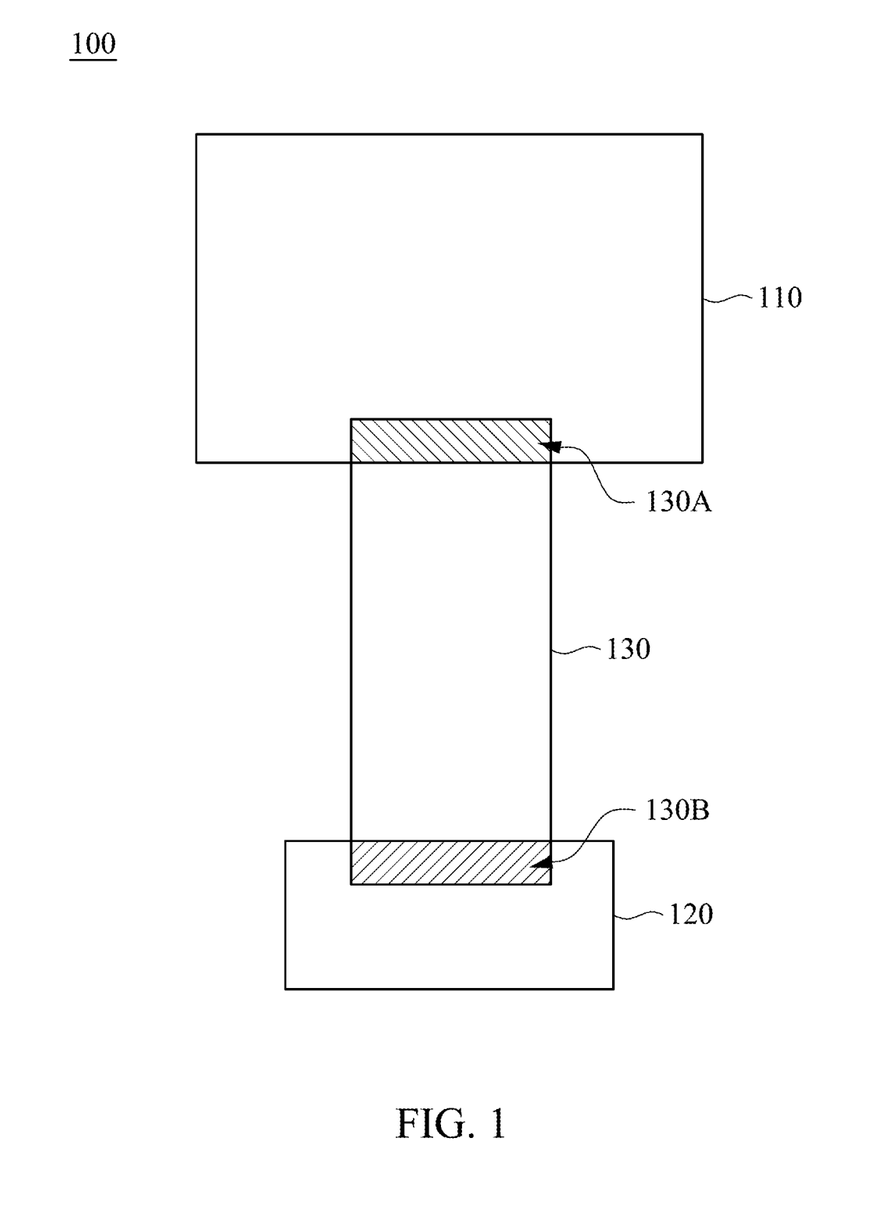
FIG. 1 is a simplified schematic planar view of a display apparatus in accordance with one or more embodiments of the invention.

FIG. 1 is a simplified schematic planar view of a display apparatus 100 in accordance with one or more embodiments of the invention. The display apparatus 100 may be utilized for various applications, such as in-vehicle infotainment systems, smart wearable devices and other applications with display functions. The display apparatus 100 includes a display panel 110, a control board 120 and a flexible printed circuit (FPC) board 130. The display panel 110 may be, for example, a liquid crystal display (LCD) panel in a twisted nematic (TN) mode, in-plane switching (IPS) mode or any other suitable mode, an organic light emitting diode (OLED) panel, or another suitable type of display panel. The display panel 110 may be flexible, and the shape thereof may be regular (such as rectangular or circular) or irregular. The control board 120 is configured for controlling display of the display panel 110. For example, if the display apparatus 100 is utilized for an in-vehicle infotainment system, the control board 120 may control signals and data for the display panel 110 to display information such as maps, virtual dashboard graphics, inside/outside temperature and/or the like. The control board 120 may be a printed circuit board with electrical circuitry and/or components, such as a front-end video processor, a microcontroller unit (MCU), an electronic control unit (ECU) and/or another electrical circuitry/component for controlling the display panel 110. The FPC board 130 is electrically connected between the display panel 110 and the control board 120. The FPC board 130 is flexible and may be bent, such that the control board 120 may be at the rear of the display panel 110 when the FPC board 130 is bent, so as to further reduce the occupied space of the display apparatus 100. As shown in FIG. 1, areas 130A and 130B of the FPC board 130 are overlapped with the display panel 110 and the control board 120, respectively. The FPC board 130 is bonded to the display panel 110 and the control board 120 respectively at the areas 130A and 130B.

Figure 2:
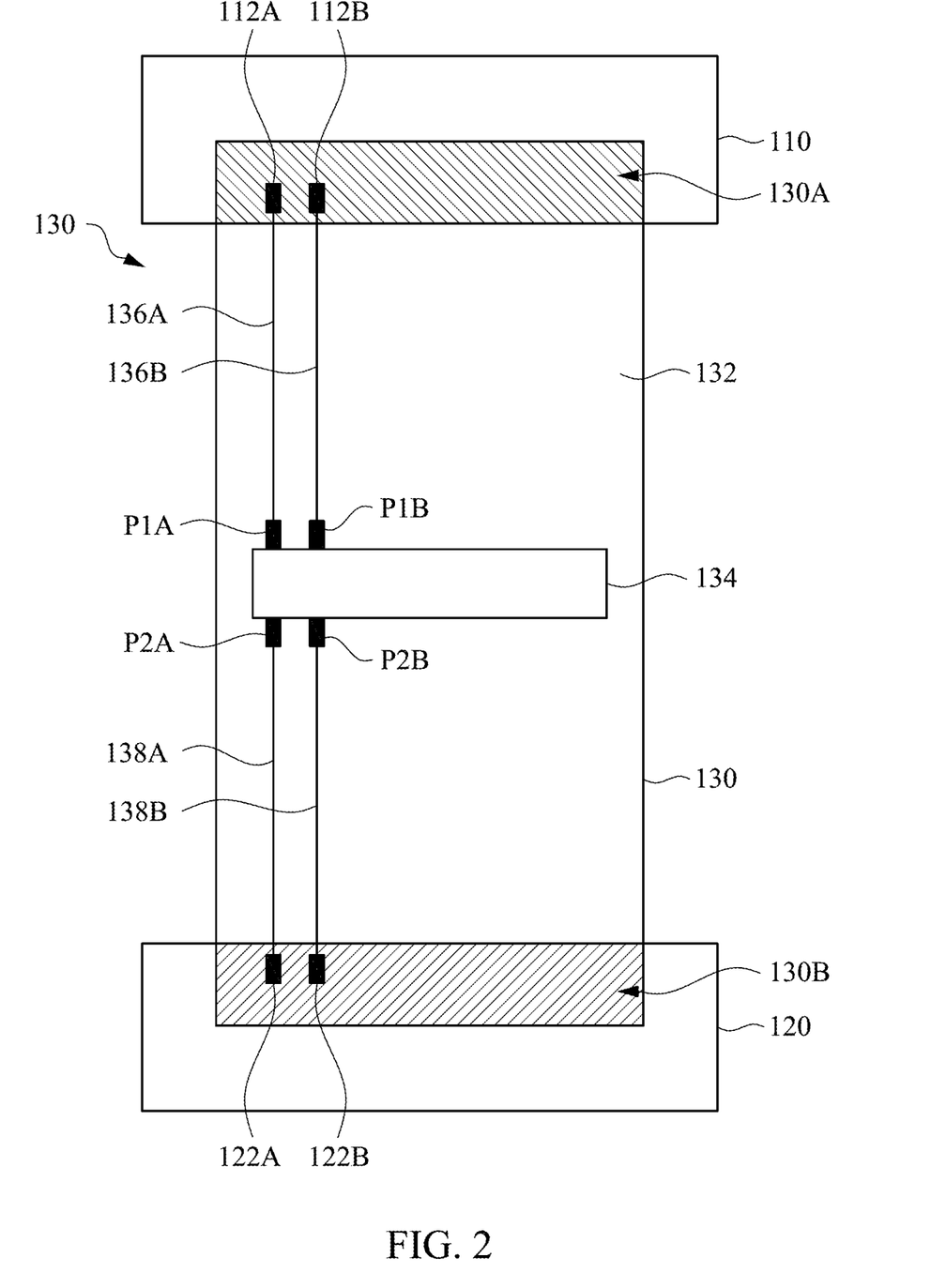
FIG. 2 is a schematic top view of the FPC board coupled with the display panel and the control board in FIG. 1 in accordance with one exemplary example.

FIG. 2 is a schematic top view of the FPC board 130 coupled with the display panel 110 and the control board 120 in accordance with one exemplary example. The FPC board 130 may be a chip-on-film (COF) package, which includes a base film 132, a chip 134, a pair of first traces 136A and 136B and a pair of second traces 138A and 138B. The chip 134 is disposed on the base film and has first pins P1A and P1B and second pins P2A and P2B. The chip 134 may be a display driver IC (DDI), a touch and display driver integration (TDDI) chip or another chip arranged for driving the display panel 110. The first traces 136A and 136B and the second traces 138A and 138B are disposed on the base film 132 and respectively at two opposite sides of the chip 134. Each of the first traces 136A and 136B has opposite first and second terminals. For the first trace 136A, the first and second terminals thereof are respectively coupled to the first pin P1A of the chip 134 and a conductive pad 112A of the display panel 110, while for the second trace 136B, the first and second terminals thereof are respectively coupled to the first pin P1B of the chip 134 and another conductive pad 112B of the display panel 110. Similarly, each of the second traces 138A and 138B has opposite first and second terminals. For the second trace 138A, the first and second terminals thereof are respectively coupled to the second pin P2A of the chip 134 and a conductive pad 122A of the control board 120, while for the second trace 138B, the first and second terminals thereof are respectively coupled to the second pin P2B of the chip 134 and another conductive pad 122B of the control board 120. The first traces 136A and 136B and the second traces 138A and 138B are all conductive and are formed of metal such as copper, gold, silver, aluminum or another suitable conductive material. In addition, as shown in FIG. 2, the first traces 136A and 136B and the second traces 138A and 138B are located at the left longitudinal side edge of the base film 132. It is noted that FIG. 2 may be modified such that the first traces 136A and 136B and the second traces 138A and 138B are located at the right longitudinal side edge of the base film 132.

Figure 3:
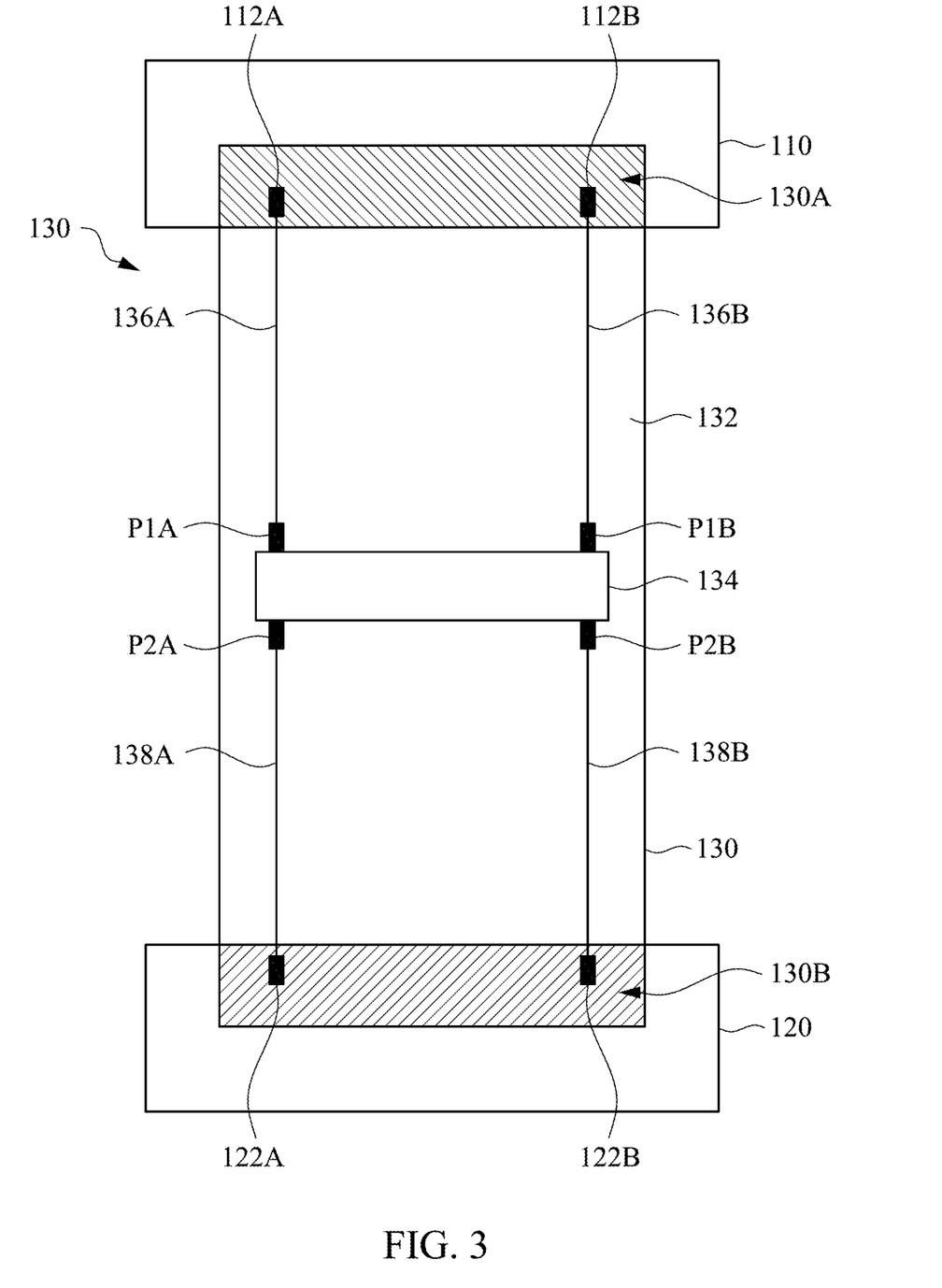
FIG. 3 is a schematic top view of the FPC board coupled with the display panel and the control board in FIG. 1 in accordance with another exemplary example.

FIG. 3 is a schematic top view of the FPC board 130 coupled with the display panel 110 and the control board 120 in accordance with another exemplary example. In this exemplary example, the first traces 136A and 136B are respectively located at two opposite longitudinal side edges of the base film 132, and the second traces 138A and 138B are respectively located at two opposite longitudinal side edges of the base film 132. In particular, as shown in FIG. 3, the first trace 136A and the second trace 138A are located at the left longitudinal side edge of the base film 132, while the first trace 136B and the second trace 138B are located at the right longitudinal side edge of the base film 132.

Figure 4A:
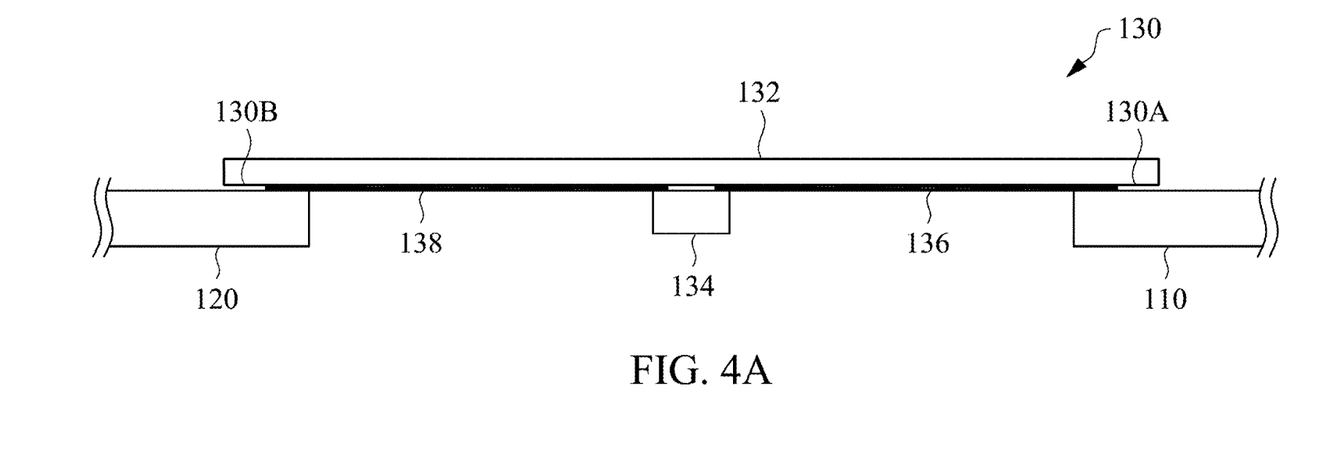
FIG. 4A illustrates a side view of the FPC board 130 in FIG. 2 in an unbent status.

FIG. 4A illustrates a side view of the FPC board 130 in FIG. 2 in an unbent status. As shown in FIG. 4, a first conductive layer 136 and a second conductive layer 138 are respectively at two sides of the chip 134. The first conductive layer 136 includes the first traces 136A and 136B and may further include other traces and/or electrical components (e.g. resistors and/or capacitors). Similarly, the first conductive layer 138 includes the second traces 138A and 138B and may further include other traces and/or electrical components.

Figure 4B:
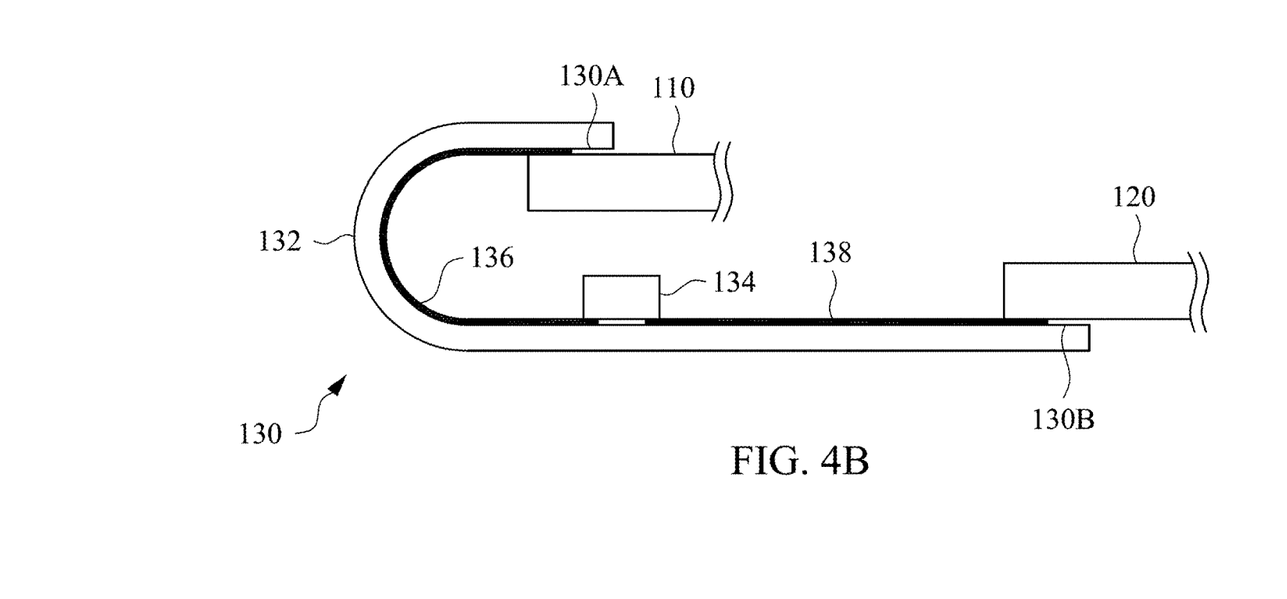
FIG. 4B illustrates a side view of the FPC board in FIG. 2 in a bent status in accordance with one exemplary example.

FIG. 4B illustrates a side view of the FPC board 130 in a bent status in accordance with one exemplary example. As shown in FIG. 4B, when the FPC board 130 is bent, the control board 120 and the chip 134 are at the rear side of the display panel 110. In particular, a portion of the base film 132 between the display panel 110 and the chip 134 is a bending portion, while portions of the base film 132 respectively at the areas 130A and 130B and the area corresponding to the chip 134 are straight portions. In some embodiments, a portion of the base film 132 between the control panel 120 and the chip 134 is also a bending portion.

Figure 5:
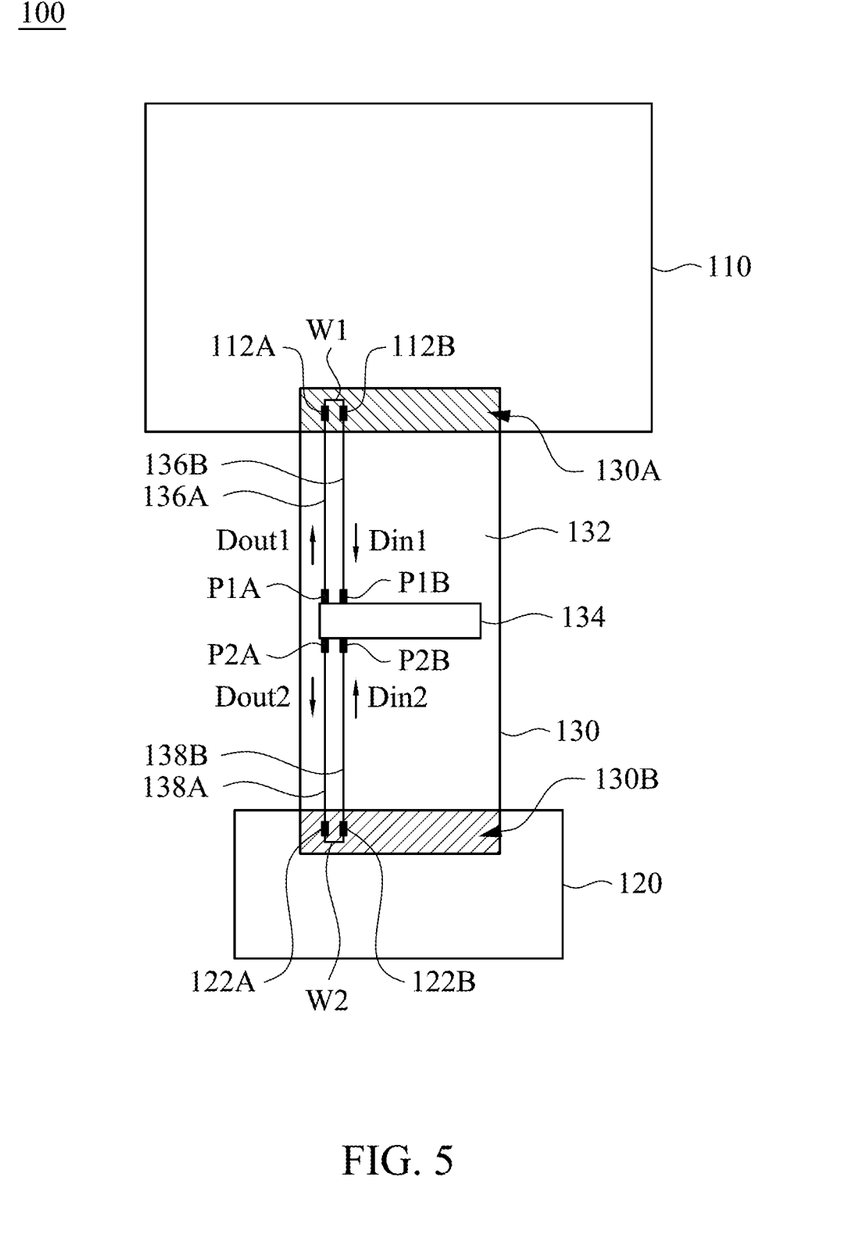
FIG. 5 illustratively shows a test signal detection of the FPC board 130 in FIG. 2.

FIG. 5 illustratively shows an auto defect detection function of the FPC board 130 in FIG. 2. For the auto defect detection function of the FPC board 130, the chip 134 transmits detection signals Dout1 and Dout2 respectively through the first and second traces 136A and 138A, and detects signals at the first and second traces 136B and 138B to determine whether the FPC board 130 is in a normal condition. The first and second traces 136A and 138A are electrically connected to the first and second traces 136B and 138B, respectively, such that the chip 134 detects the signals respectively corresponding to transmitted detection signals Dout1 and Dout2 at the first and second traces 136B and 138B. In one example, the conductive pads 112A and 112B of the display panel 110 are shorted by a wire W1, and the conductive pads 122A and 122B of the control board 120 are shorted by a wire W2. The wires W1 and W2 may be substituted by other electrical components (such as resistors, transistors, etc.) in another example. As such, after the FPC board 130 is bonded to the display panel 110 and the control board 120, when the chip 134 transmits the detection signals Dout1 and Dout2 respectively through the first and second traces 136A and 138A, the detection signal Dout1 passes through the conductive pads 112A and 112B and the wire W1 to become a reception signal Din1, and the detection signal Dout2 passes through the conductive pads 122A and 122B and the wire W2 to become a reception signal Din2.

Figure 6:
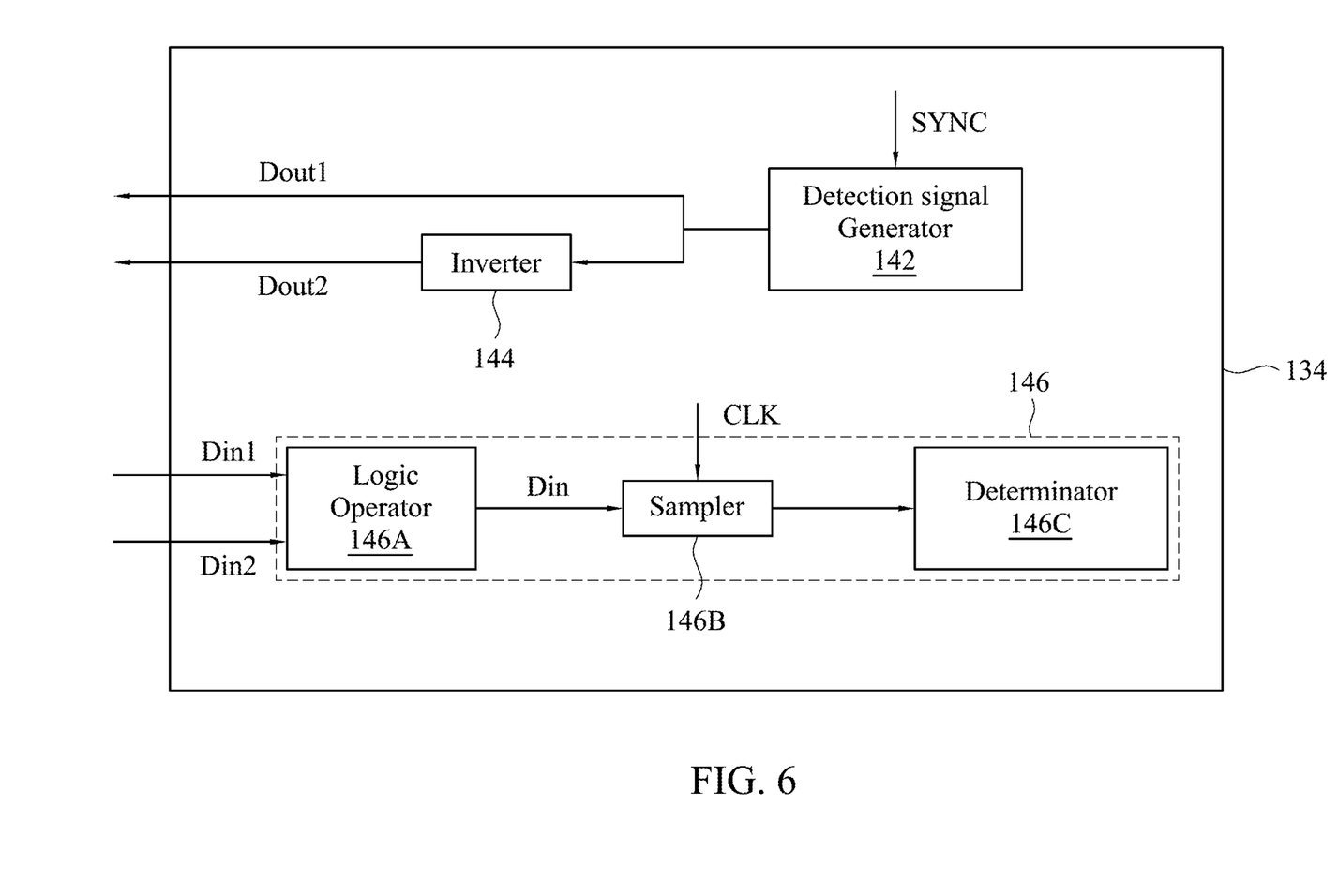
FIG. 6 is a schematic block diagram of the chip in FIG. 2 in accordance with one or more embodiments of the invention.

FIG. 6 is a schematic block diagram of the chip 134 in accordance with one or more embodiments of the invention. As shown in FIG. 6, the chip 134 includes a detection signal generator 142, an inverter 144 and a test signal detector 146. The detection signal generator 142 is configured to generate the detection signal Dout1 according to a synchronization signal SYNC. In some embodiments, the synchronization signal SYNC may also be used for controlling display of the display panel 110. In such case, the frequency of the synchronization signal SYNC is the same as the frame rate of the display panel 110. The inverter 144 is configured to invert the detection signal Dout1 to obtain the detection signal Dout2 that is phase-inverted with respect to the detection signal Dout1. The inverter 144 may be a NOT logic gate or another suitable component. The test signal detector 146 is configured to receive and process the reception signals Dout1 and Dout2 to determine whether the FPC board 130 works normally with the display panel 110 and the control board 120.

In some embodiments, as shown in FIG. 6, the test signal detector 146 includes a logic operator 146A, a sampler 146B and a determinator 146C. The logic operator 146A is configured to perform an exclusive-OR logic operation on the reception signals Din1 and Din2 to obtain an identification signal Din. If the signal levels of the reception signals Din1 and Din2 are the same (i.e. all high or all low), then the signal level of the identification signal Din is high; otherwise, if the signal levels of the reception signals Din1 and Din2 are different (i.e. one is high and the other is low), then the signal level of the identification signal Din is low. The logic operator 146A may be an exclusive-OR (XOR) logic gate or a group of other type logic gates known in the art. The sampler 146B is configured to perform sampling on the identification signal Din according to a clock signal CLK. The determinator 146C is configured to determine whether the FPC board 130 works normally with the display panel 110 and the control board 120 based on the sampling result of the sampler 146B on the identification signal Din.

Figure 7:
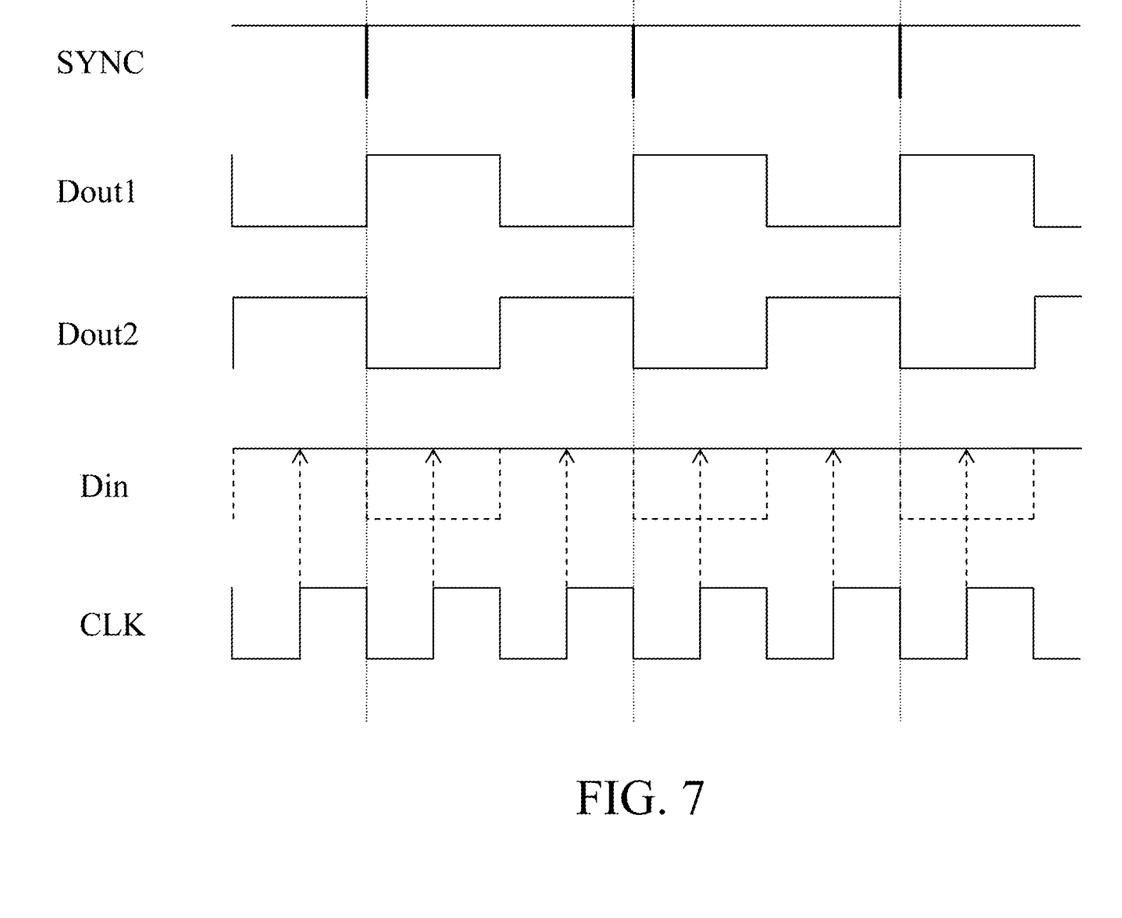
FIG. 7 is a timing diagram showing waveforms of signals associated with performing a signal detection illustrated in FIG. 6 in accordance with one exemplary example.

FIG. 7 is a timing diagram showing waveforms of the signals associated with performing a signal detection illustrated in FIG. 6 in accordance with one exemplary example. In FIG. 7, the waveforms of the synchronization signal SYNC, the detection signals Dout1 and Dout2, the identification signal Din and the clock signal CLK in a certain time duration are shown. The detection signals Dout1 and Dout2 are phase-inverted with respect to each other. For each period of the detection signals Dout1 and Dout2, the durations of the high and low levels are substantially the same. In addition, the frequency of the clock signal CLK is substantially two times of the synchronization signal SYNC. The identification signal Din may be sampled at the times respectively corresponding to the rising edges of the clock signal CLK. If the sampled levels of the identification signal Din are all high, then FPC board 130 is determined to work normally with the display panel 110 and the control board 120. Oppositely, if at least one of the sampled levels of the identification signal Din is low (for example, some of the sampled values from the dashed waveform in FIG. 7 are low), then the FPC board 130 is determined to work in an abnormal condition. It is noted that the sampling positions of the identification signal Din may be modified according to various embodiments, e.g. to the falling edges of the clock signal CLK or each time between adjacent rising and falling edges of the clock signal CLK, and is not limited to the illustration in FIG. 7.

In some embodiments, in addition to the first pins P1A and P1B and the second pins P2A and P2B, the chip 134 further has an abnormal notification pin for notifying an abnormal condition of the FPC board 130. For example, if the FPC board 130 is determined to work in an abnormal condition, then the chip 134 may transmit a warning signal via the abnormal notification pin to the control board 120.

Figure 8:
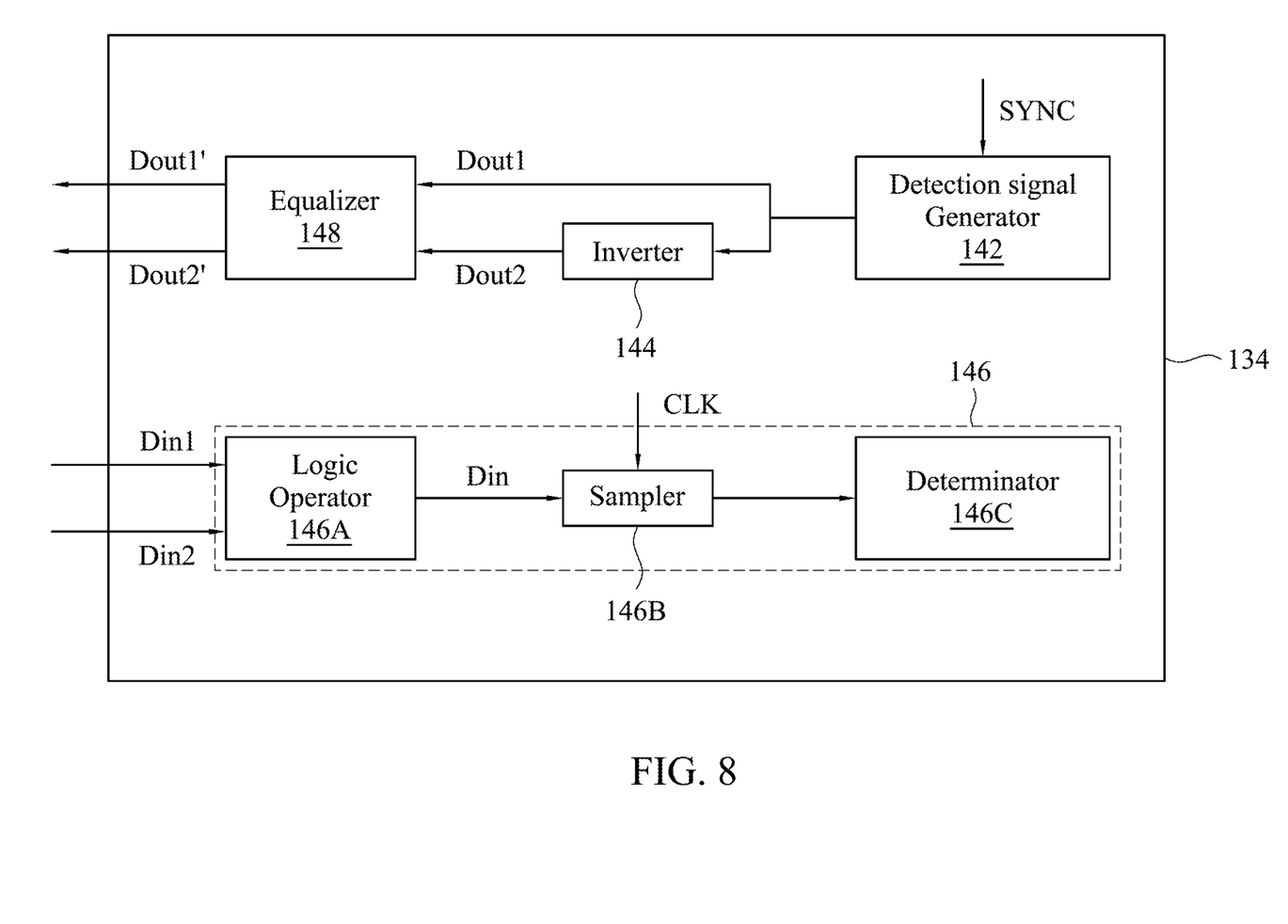
FIG. 8 is a schematic block diagram of the chip in FIG. 2 in accordance with one or more embodiments of the invention.

FIG. 8 is a schematic block diagram of the chip 134 in accordance with one or more embodiments of the invention. In comparison with the block diagram shown in FIG. 6, in FIG. 0.8, in addition to the detection signal generator 142, the inverter 144 and the test signal detector 146, the chip 134 further includes an equalizer 148 that is configured to equalize the detection signals Dout1 and Dout2 to obtain equalized detection signals Dout1' and Dout2' with smoother waveforms, such that the chip 134 outputs the equalized detection signals Dout1' and Dout2' respectively via the first and second pins P1A and P2A instead of the detection signals Dout1 and Dout2. If the waveforms of the detection signals Dout1 and Dout2 are rectangular waveforms, then the equalizer 148 is configured to round off the sharp rising and falling edges of the rectangular waveforms. The frequency of the synchronization signal SYNC may be 60 Hz, and the equalizer 148 may be active to equalize the detection signals Dout1 and Dout2, in order to reduce electromagnetic interference (EMI).

Figure 9:
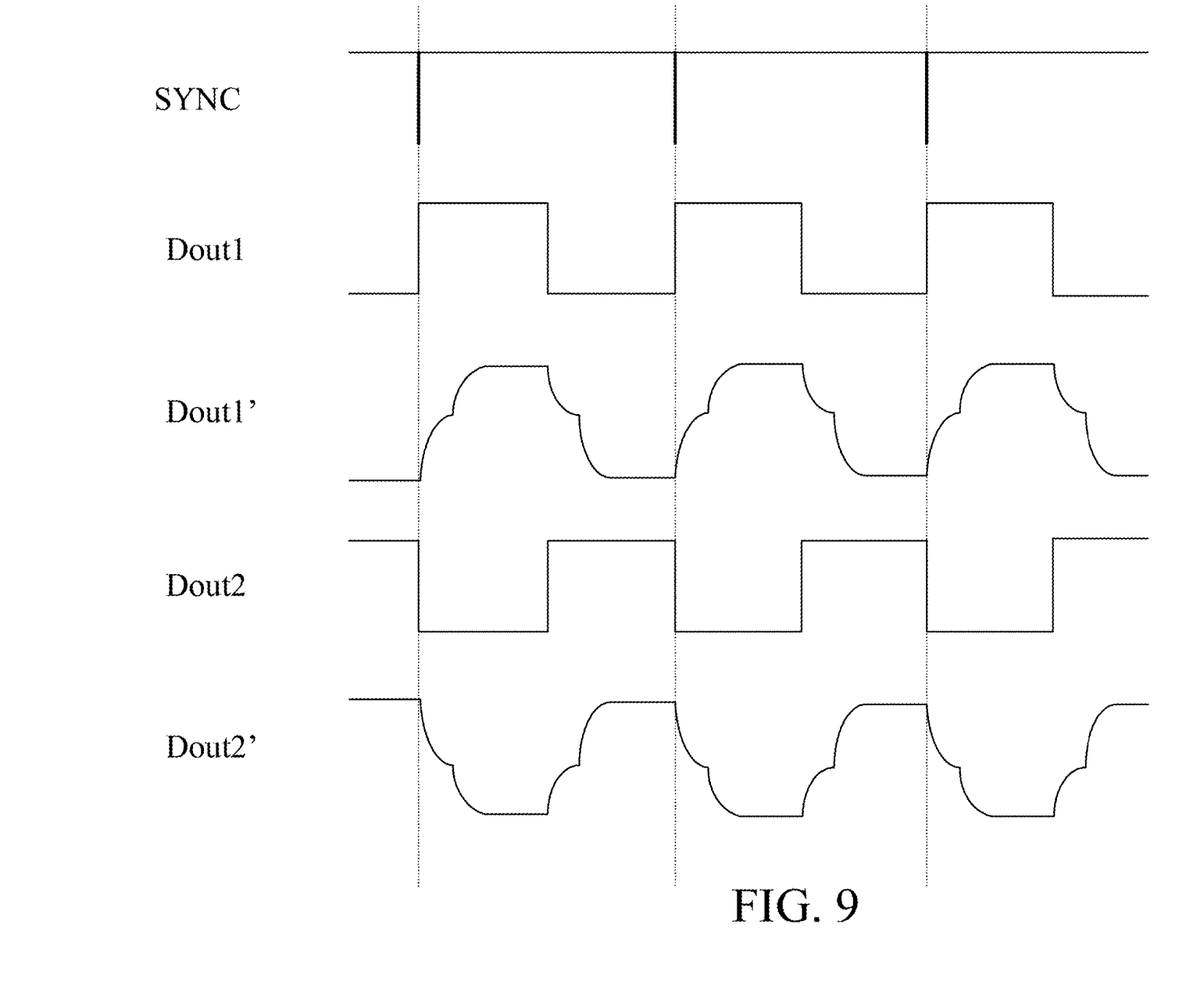
FIG. 9 is a timing diagram showing waveforms of some signals in FIG. 8 in accordance with one exemplary example.

FIG. 9 is a timing diagram showing the synchronization signal SYNC, the detection signal Dout1, the first equalized detection signal Dout1', the detection signal Dout2 and the second equalized detection signal Dout2' in FIG. 8 in accordance with one exemplary example. As can be seen from FIG. 9, after the equalization process by the equalizer 148, the signal level of each of the first and second equalized detection signals Dout1' and Dout2' rises and falls more smoothly, so as to reduce electromagnetic radiation due to sharp rising and falling edges of the original detection signals Dout1 and Dout2.

It will be apparent to those skilled in the art that various modifications and variations can be made to the structure of the invention without departing from the scope or spirit of the invention. In view of the foregoing, it is intended that the invention cover modifications and variations of this invention provided they fall within the scope of the following claims.

What is claimed is:

1. A flexible printed circuit (FPC) board comprising:
   a base film;
   a pair of first traces disposed on the base film, each of the first traces having opposite first and second terminals; and
   a chip disposed on the base film and having first pins that are respectively coupled to the first terminals of the first traces;
   wherein when the FPC board is bonded to a display panel through the second terminals of the first traces that are shorted to each other, the chip is configured to transmit a first detection signal through one of the first pins and receive a first reception signal through the other of the first pins, and to determine whether the FPC board works normally with the display panel depending on the first reception signal.

2. The FPC board of claim 1, wherein the first traces are located at one longitudinal side edge of the base film.

3. The FPC board of claim 1, wherein the first traces are respectively located at two opposite longitudinal side edges of the base film.

4. The FPC board of claim 1, further comprising:
   a pair of second traces disposed on the base film, each of the second traces having opposite first and second terminals;
   wherein the chip further has second pins that are respectively coupled to the first terminals of the second traces, and when the FPC board is also bonded to a control board through the second terminals of the second traces that are shorted to each other, the chip is also configured to transmit a second detection signal through one of the second pins and receive a second reception signal through the other of the second pins, and to determine whether the FPC board works normally with the display panel and the control board depending on the first and second reception signals.

5. The FPC board of claim 4, wherein the first traces and the second traces are located at one longitudinal side edge of the base film.

6. The FPC board of claim 4, wherein one of the first traces and one of the second traces are located at one longitudinal side edge of the base film, and the other of the first traces and the other of the second traces are located at the other longitudinal side edge of the base film.

7. The FPC board of claim 4, wherein the second detection signal is an invented signal of the first detection signal.

8. The FPC board of claim 4, wherein the chip comprises:
   a detection signal generator configured to generate the first detection signal according to a synchronization signal;
   an inverter configured to invert the first detection signal to obtain the second detection signal; and
   a test signal detector configured to receive and process the first and second reception signals to determine whether the FPC board works normally with the display panel and the control board.

9. The FPC board of claim 8, wherein the chip further comprises:
   an equalizer configured to equalize the first detection signal and the second detection signal.

10. The FPC board of claim 8, wherein the test signal detector comprises:
    a logic operator configured to perform an exclusive-OR logic operation on the first and second reception signals to obtain an identification signal;
    a sampler configured to perform sampling on the identification signal; and
    a determinator configured to determine whether the FPC board works normally with the display panel and the control board based on the sampling result of the sampler on the identification signal.

11. A display apparatus comprising:
    a display panel;
    a control board for controlling display of the display panel; and
    a flexible printed circuit (FPC) board bonded to the display panel and the control board, the FPC board comprising:
    a base film;
    a chip disposed on the base film and having first pins and second pins;
    a pair of first traces disposed on the base film, each of the first traces having opposite first and second terminals, wherein the first terminals of the first traces are coupled to the first pins of the chip, and the FPC board is bonded to the display panel through the second terminals of the first traces; and
    a pair of second traces disposed on the base film, each of the first traces having opposite first and second terminals, wherein the first terminals of the second traces are coupled to the second pins of the chip, and the FPC board is bonded to the display panel through the second terminals of the second traces;
    wherein the chip is configured to transmit a first detection signal and a second detection signal respectively through one of the first pins and one of the second pins and receive a first reception signal and a second reception signal respectively through the other of the first pins and the other of the second pins, and to determine whether the FPC board works normally with the display panel and the control board depending on the first reception signal and the second reception signal.

12. The display apparatus of claim 11, wherein the first traces and the second traces are located at one longitudinal side edge of the base film.

13. The display apparatus of claim 11, wherein one of the first traces and one of the second traces are located at one longitudinal side edge of the base film, and the other of the first traces and the other of the second traces are located at the other longitudinal side edge of the base film.

14. The display apparatus of claim 11, wherein the second detection signal is an invented signal of the first detection signal.

15. The display apparatus of claim 11, wherein the chip comprises:
   a detection signal generator configured to generate the first detection signal according to a synchronization signal; and
   an inverter configured to invert the first detection signal to obtain the second detection signal.

16. The display apparatus of claim 15, wherein the chip further comprises:
   an equalizer configured to equalize the first detection signal and the second detection signal.

17. The display apparatus of claim 15, wherein the chip further comprises:
   a logic operator to configured to perform an exclusive-OR logic operation on the first and second reception signals to obtain an identification signal;
   a sampler configured to perform sampling on the identification signal; and
   a determinator configured to determine the bonding result of the FPC board to the display panel and the control board based on the sampling result of the sampler on the identification signal.

18. The display apparatus of claim 11, wherein the chip is a display driver IC (DDI) or a touch and display driver integration (TDDI) chip.

19. The display apparatus of claim 11, wherein the display panel is a liquid crystal display panel.

20. The display apparatus of claim 11, wherein the control board comprises a front-end video processor and a microcontroller unit (MCU).

* * * * *